United States Patent [19]

Jedlicka et al.

[11] Patent Number: 4,814,296
[45] Date of Patent: Mar. 21, 1989

[54] METHOD OF FABRICATING IMAGE SENSOR DIES FOR USE IN ASSEMBLING ARRAYS

[75] Inventors: Josef E. Jedlicka, Rochester; Kimberly R. Page, Penfield; Alain E. Perregaux; Fred F. Wilczak, Jr., both of Pittsford, all of N.Y.

[73] Assignee: Xerox Corporation, Stamford, Conn.

[21] Appl. No.: 90,827

[22] Filed: Aug. 28, 1987

[51] Int. Cl.$^4$ .......................................... H01L 21/306
[52] U.S. Cl. .................................. 437/226; 437/946;
437/947; 437/974; 437/981; 437/249;
148/DIG. 28; 156/644; 156/645; 156/647;
156/653
[58] Field of Search ............... 437/226, 249, 946, 947,
437/974, 981; 156/644, 645, 647, 653;
148/DIG. 28

[56] References Cited

U.S. PATENT DOCUMENTS

| | | | |
|---|---|---|---|
| 3,078,559 | 2/1963 | Thomas | 437/226 |
| 3,542,266 | 11/1970 | Woelfle | 437/226 |
| 3,579,815 | 5/1971 | Gentry | 437/226 |
| 3,608,186 | 9/1971 | Hutson | 29/583 |
| 3,628,106 | 12/1971 | Frank et al. | 317/234 R |
| 3,628,107 | 12/1971 | Kennedy | 317/235 R |
| 3,698,080 | 10/1972 | Berner | 437/226 |
| 3,838,501 | 10/1974 | Umbaugh | 437/226 |
| 3,852,876 | 12/1974 | Sheldon et al. | 29/583 |
| 3,972,113 | 8/1976 | Nakata et al. | 29/580 |
| 4,033,027 | 7/1977 | Fair et al. | 437/226 |
| 4,040,877 | 8/1977 | Johnson et al. | 148/187 |
| 4,135,291 | 1/1979 | Tursky et al. | 29/574 |
| 4,179,794 | 12/1979 | Kosugi et al. | 29/580 |
| 4,217,689 | 8/1980 | Fujii et al. | 29/583 |
| 4,236,296 | 12/1980 | Woolhouse et al. | 29/569 L |
| 4,237,601 | 12/1980 | Woolhouse et al. | 29/583 |
| 4,259,682 | 3/1981 | Gamo | 357/55 |
| 4,355,457 | 10/1982 | Barlett et al. | 29/583 |
| 4,604,161 | 8/1986 | Araghi | 156/645 |
| 4,610,079 | 9/1986 | Abe et al. | 29/583 |
| 4,624,741 | 11/1986 | Daniele | 156/645 |

FOREIGN PATENT DOCUMENTS

| | | |
|---|---|---|
| 55-124243 | 9/1980 | Japan . |
| 0048932 | 3/1986 | Japan ............ 437/226 |
| 1118536 | 7/1968 | United Kingdom . |

Primary Examiner—Brian E. Hearn
Assistant Examiner—Beverly Ann Pawlikowski
Attorney, Agent, or Firm—Frederick E. McMullen

[57] ABSTRACT

A process for forming individual dies having faces that allow the dies to be assembled against other like dies to form one and/or two dimensional scanning arrays wherein the active side of a wafer is etched to form small V-shaped grooves defining the die faces, relatively wide grooves are cut in the inactive side of the wafer opposite each V-shaped groove, and the wafer cut by sawing along the V-shaped grooves, the saw being located so that the side of the saw blade facing the die is aligned with the bottom of the V-shaped groove so that there is retained intact one side of the V-shaped groove to intercept and prevent cracks and chipping caused by sawing from damaging the die active surface and any circuits thereon.

16 Claims, 3 Drawing Sheets

METHOD OF FABRICATING IMAGE SENSOR DIES FOR USE IN ASSEMBLING ARRAYS

The invention relates to image sensor dies and method of fabricating such dies, and more particularly, to a method of fabricating image sensor die for assembly with other like dies to form a longer composite array without sacrifice of image quality.

Image sensor dies for scanning document images, such as Charge Coupled Devices (CCDs), typically have a row or linear array of photosites together with suitable supporting circuitry integrated onto silicon. Usually, a die of this type is used to scan line by line across the width of a document with the document being moved or stepped lengthwise in synchronism therewith.

In the above application, the image resolution is proportional to the ratio of the scan width and the number of array photosites. Because of the difficulty in economically designing and fabricating long dies, image resolution for the typical die commercially available today is relatively low when the die is used to scan a full line. While resolution may be improved electronically as by interpolating extra image signals, or by interlacing several smaller dies with one another in a non-colinear fashion so as to crossover from one die to the next as scanning along the line progresses, electronic manipulations of this type adds to both the complexity and the cost of the system. Further, single or multiple die combinations such as described above usually require more complex and expensive optical systems.

However, a long or full width array, having a length equal to or larger than the document line and with a large packing of co-linear photosites to assure high resolution, has been and remains a very desirable but so far unattainable aim. In the pursuit of a long or full width array, forming the array by assembling several small dies together end to end has often been postulated. However, the need, which is critical, to provide dies whose photosites extend to the border or edge of the die, so as to assure continuity when the die is assembled end to end with other dies, and at the same time provide edges that are sufficiently smooth and straight to be assembled together without loss of image data has proved to be a formidable obstacle.

Although the standard technique of scribing and cleaving silicon wafers used by the semiconductor industry for many years produces dies having reasonably controlled dimensions, the microscopic damage occurring to the die surface during the scribing operation has effectively precluded the disposition of the photosites at the die edge. This is because the top surface of silicon wafers is virtually always parallel to the <100> plane of the crystalline lattice so that, when a wafer of this type is cut or diced with a high speed diamond blade, chips and slivers are broken away from the top surface of the wafer in the direct vicinity of the channel created by the blade. This surface chipping typically extends to about 50 μm, thus rendering it impossible for active elements to be located any closer than about 50 μm from the dicing channel. As a result, long linear arrays made up of individual dies assembled together end to end are only possible for low resolution devices, i.e., those having a spatial frequency of 5 lines per mm or less.

An earlier patent by Araghi, U.S. Pat. No. 4,604,161 addressed this problem. Araghi discloses the concept of chemically etching a V-groove in the surface of a wafer followed by a partial cut in the back of the wafer forming an inside groove directly underneath the V-groove. This allows the dies to be separated from one another by means of a mechanical cleaving or breaking operation. In this approach, the cut through the top surface of the wafer, in which the active elements are built, was not made with an abrasive blade but by means of the chemically eched V-groove. As a result, the propagation of mechanical damage along the top surface of the wafer was avoided, allowing active elements to be placed as close to the V-groove as the accuracy of the photolithography and the etching operation would allow.

However, the Araghi technique leaves at least one face of the cleaved chip with a protruding knife edge defined by two intersecting <111> planes. This knife edge can be very delicate and easily damaged. Such damage may require that the chip be rejected, reducing fabrication yields and increasing cost.

In the prior art, U.S. Pat. No. 4,610,079 to Abe et al discloses a method of dicing a semiconductor wafer in which a groove wider than the dicing line is formed over the dicing line to limit cracks and chipping generated during the subsequent dicing process. U.S. Pat. No. 4,624,741 to Daniele discloses a fabrication method in which the aforementioned Araghi process is applied to the making of electro-mechanical modulating dies, while U.S. Pat. No. 3,608,186 to Hutson discloses a method of manufacturing semiconductors in which continuous grooves are etched in the bottom and top of a wafer to avoid damage during the separation process. U.S. Pat. No. 3,628,107 to Kennedy is similar to Hutson but employs glassed grooves instead. In U.S. Pat. No. 4,033,027 to Fair et al, there is disclosed a process for separating semiconductor wafers into chips where a metalized grid is formed on the underside of the wafer, with cutting being done through the metal and partially into the wafer followed by breaking of the wafer along the cut. Another patent, U.S. Pat. No. 4,217,689 to Fujii et al describes a fabrication process for semiconductors in which an insulation coating is first placed on the surface of the substrate following which a partial groove is formed by sawing with the substrate then being broken along the groove.

Other prior art U.S. Pat. Nos. 4,236,296 and 4,237,601 to Woolhouse et al disclose process steps for cleaving semiconductor laser diode wafers in which a V-groove is etched first followed by mechanical breaking of the wafer along the groove, while U.S. Pat. No. 4,355,457 to Barlett discloses a method of forming a mesa in a semsiconductor device in which channels are cut after which the wafer is etched to remove scars and the wafer broken along the channels. And U.S. Pat. Nos. 3,852,876; 3,972,113; 4,040,877; 4,135,291; 4,179,794; 4,259,682; and 3,628,106; United Kingdom Pat. No. 1,118,536; and Japanese Pat. No. 55-124,243, disclose various other techniques and processes for fabricating transistors, and particularly processes which provide grooves intended to separate and isolate circuit elements from one another.

The present invention seeks to address and rectify the above by providing a method of fabricating high resolution image sensor dies from a silicon wafer so that the dies have precision faces to enable the dies to be assembled with other like dies to form a larger array without image loss or distortion at the points where the dies are assembled together, comprising the steps of: etching small V-shaped grooves in one side of a <100> silicon wafer delineating the faces of the chips where the chips are to be separated from the wafer, the walls of the V-shaped grooves paralleling the <111> crystalline planes of the wafer; forming relatively wide grooves in the opposite side of the wafer opposite each of the V-shaped grooves, the axis of the wide grooves being parallel to the axis of the V-shaped groove opposite thereto; and sawing the wafer along the V-shaped grooves with one side of the cut made by sawing being substantially coextensive with the bottom of the V-shaped grooves whereby one side of the V-shaped grooves is obliterated by the sawing, the sides of the V-shaped grooves that remain serving to prevent development of fractures in the die beyond the remaining side as the wafer is being sawed.

IN THE DRAWINGS

Figure 6A:
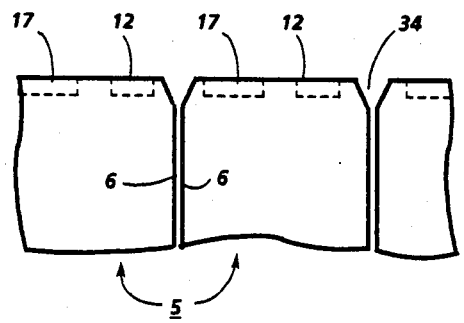
Figure 6B:
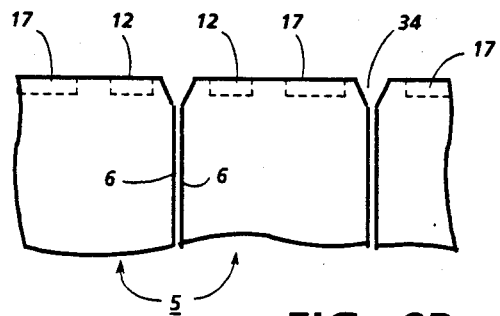

FIG. 6a is an enlarged view depicting plural dies fabricated according to the teachings of the present invention in assembled relationship to orm a two dimensional array with photosite row and active circuits opposing one another at the point where the dies are assembled together; and FIG. 6b is an enlarged view depicting plural dies fabricated according to the teachings of the present invention in assembled relationship to form a two dimensional array with photosite rows opposing one another at the point where the dies are assembled together.

As used herein, the term face refers to any side or end of a die that is desired to be precision formed for the purpose of being assembled with other like dies to form a larger one and/or two dimensional array.

Figure 1:
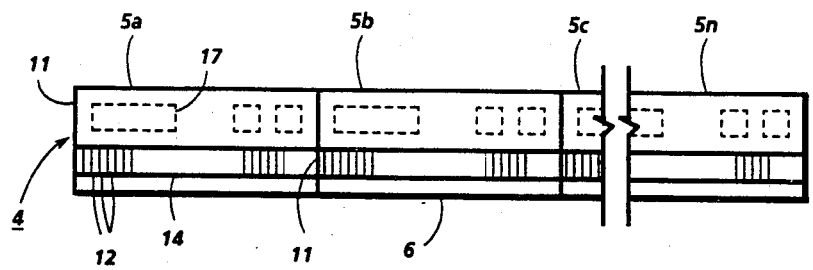
FIG. 1 is a top view illustrating a long array composed of several dies fabricated in accordance with the teachings of this invention assembled together.
Figure 2:
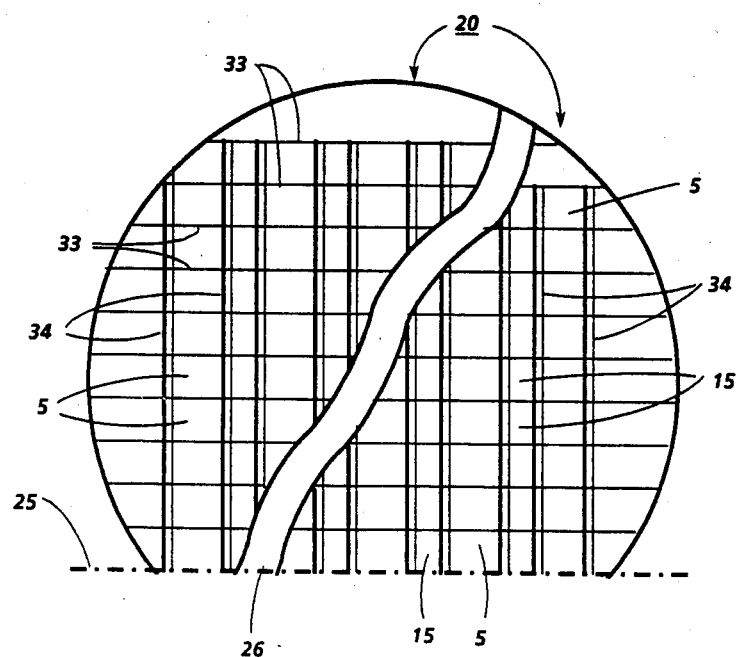
FIG. 2 is a top view of a silicon wafer prior to cutting individual dies therefrom.

Referring particularly to FIG. 1 of the drawings, there is shown a long or full width scanning array 4 composed of a plurality of smaller sensor dies 5 assembled together end to end (depicted by numerals 5a, 5b, ... 5n in FIG. 1 of the drawings). Dies 5, which may, for example, comprise Charge Coupled Devices (CCDs), are fabricated in accordance with the teachings of the invention as will appear more fully hereinbelow. As will be understood by those skilled in the art, array 4 is typically used to read or scan a document original line by line and convert the document image to electrical signals. Preferably, array 4 is a full length array having an overall length equal to or slightly greater than the width of the largest document to be scanned. As will appear, dies 5 are fabricated so that row 14 of photosites 12 of each die extends adjacent the edges or ends of the die so that when dies 5 are assembled together, there is formed a continuous and uninterrupted row of photosites with a substantially uniform periodicity on array 4.

Typically, dies 5 are made of relatively thin silicon and has a generally rectangular shape, with the axis of row 14 of photosites paralleling the longitudinal axis of the dies. While a single row 14 of photosites 12 is shown, plural photosite rows may be contemplated. Other active elements such as shift registers, gates, pixel clock, etc. (designated generally by the numeral 17 herein), are preferably formed integral with die 5. Suitable external connectors (not shown) are provided for electrically coupling the dies 5 to related external circuitry.

When a single die 5 is used for scanning purposes, the image resolution achieved is a function of the number of photosites 12 that can be fabricated on the die divided by the width of the scan line. Since the number of photosites 12 that can be packed onto a single die is limited, it would be advantageous if several dies could be assembled together end to end to form a longer array, and preferably to form a full width or full size array whose scan area is coextensive with the scan line.

Referring to FIGS. 2-5, dies 5 are fabricated from a relatively large wafer 20 of <100> silicon of the type commonly employed to make integrated circuits. Normally, wafer 20 has a plurality of dies 5 previously fabricated thereon by integrated circuit forming techniques, it being understood that the row of photosites 14 together with any other circuitry is formed on wafer 20 prior to separating dies 5 therefrom.

By means of standard photolithographic techniques and anisotropic etchants such as Ethylenediamine/Pyrocathechol/$H_2O$ solution (EDA), V-grooves 34 are formed in top layer 23 of the wafer. Other processes for forming grooves 34 with the exact location and size desired may be contemplated such as plasma etching, reactive ion etching, etc. As will be understood by those skilled in the art, a flat 26 is normally present on industrial wafers, which is aligned within a fraction of a degree to the (110) crystalline axis 25. This flat makes it possible for V-groove 34 to be accurately aligned with (110) crystalline orientation, typically within one degree. V-grooves 34 delineate the short sides or "ends" 11 of the dies 5 and define therebetween a portion 15 of the wafer that will eventually be scrapped as will appear more fully. Additionally, some reference pattern such as lines 33 are placed on the surface of the wafer during processing to define the long sides (i.e., top and bottom) 6 of the dies 5.

Grooves 34 are relatively small with walls or sides 35, 36. During cutting as will appear, one side (i.e., side 36) of V-shaped grooves 34 is obliterated leaving the remaining side (i.e., side 35) substantially intact. The depth D of grooves 34 is preferably chosen so that the effective width (L' in FIG. 5) that is established between adjoining dies 5 on assembly of the dies together end to end approximates the distance L between photosites 12. This preserves a substantial uniform periodicity among photosites across the width of the assembled scanning array 4.

Grooves 34 typically range in size between a width W of from 5 to 20 $\mu$m with a depth D of from 2 to 10 $\mu$m. However, other widths W and depths D may be envisioned. In one example, a width W of 7 μm and a depth D of 5 μm was found suitable.

As will be understood, sides 35,36 of grooves 34 in wafer 20 are defined by the <111> crystalline planes 37. In principle, other crystalline orientations may lead to different width-to-deph ratios of grooves 34 as will be appreciated.

A second groove 40 is formed in the bottom or inactive surface 24 of wafer 20 opposite and parallel to each V-shaped groove 34. Grooves 40, which may be formed mechanically by sawing, have a depth such that base 42 of grooves 40 is spaced sufficiently far from any active circuits 17 on die 5 to prevent interference therewith. Grooves 40 may, following forming, be etched in EDA or another suitable anisotropic etchant to remove any stresses resulting from formation thereof. Grooves 40 are relatively wide and substantially wider than grooves 34.

Grooves 40 are normally formed only under and opposite to V-shaped shaped grooves 34 delineating ends 11 of dis 5. Since damage to the dies 5 along th sides 6 is ordinarily not a problem inasmuch as any active circuits can be located at a safe distance from both sides 6, and since the dies in this embodiment are not intended to be operatively abutted together along either side 6, grooves 40 in opposed relation to the reference lines 33 are not ordinarily provided.

Figure 3:
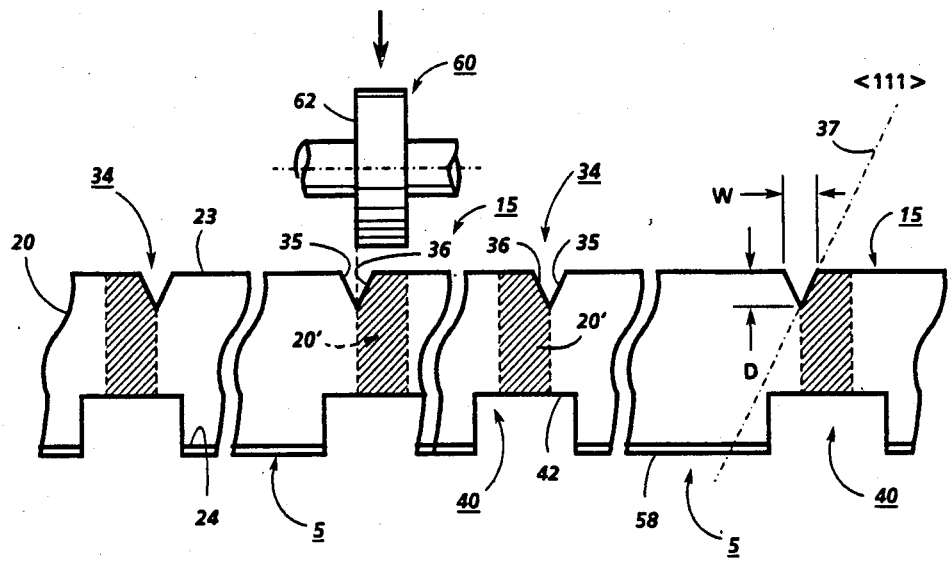
FIG. 3 is an enlarged side view in cross section of the water shown in FIG. 2 showing details of the die fabricating technique of the present invention including the small V-shaped groove etched in the wafer to delineate the die end and the location of the saw blade relative thereto during cutting.
Figure 4:
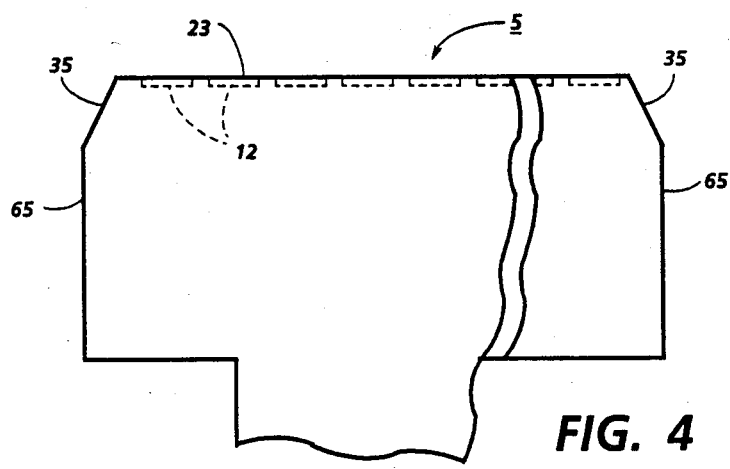
FIG. 4 is an enlarged side view in cross section depicting the remaining side of the V-shaped groove following separation.
Figure 5:
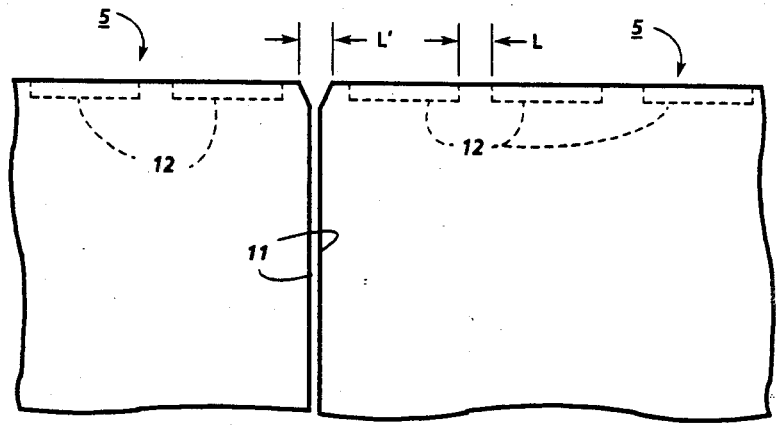
FIG. 5 is an enlarged view depicting plural dies fabricated according to the teachings of the present invention in assembled relationship to form a one dimensional array, showing one possible dimensional relation between photosite spacing and the walls of the groove formed by the remnants of the V-shaped grooves on assembly of the dies together.

Referring particularly to FIG. 3, following the forming of lines 33 and of grooves 34 and 40 in wafer 20, a suitable wafer mounting medium 58 is applied to the inactive surface 24 of wafer 20 as a means to hold the wafer securely and to control its location accurately. The wafer is thus accurately secured in position for cutting opposite a suitable cutting device such as a high speed diamond dicing blade 60. Wafer 20 is positioned in such a way that blade 60 is opposite to and above the groove 34 with the plane of blad 60 parallel with the longitudinal axis of groove 34 and the side 62 of blade 60 that faces the active die 5 substantially aligned with the bottom of groove 34.

It is understood that the width of blade 60 and hence the width of the cut made by blade 60 is substantially larger han the width of V-shaped grooves 34 etched in wafer 20. As a result, the remainder of blade 60 not only overlaps the far side wall 36 of the V-shaped groove thereunder but also extends over the portion 15 of wafer 20 bordering groove 34. As a result, during sawing, side 36 of the V-shaped groove 34 and a portion of the wafer 20 (designated by 20') bordering the V-shaped groove are cut into and hence obliterated from scrap portion 15 which itself is discarded.

Blade 60 cuts through water 20 to groove 40 in inactive side 24 of wafer 20, separating die 5 from water 20 and leaving a precision edge 65 with side 35 of V-shaped groove 34 spanning or bridging between active surface 23 of the chip and edge 65. Cracks, chipping, etc. resulting from the sawing action of blade 60 are concentrated at and intercepted by side 35 of groove 34, avoiding damage to the active surface 23 of the die and any circuits 17 thereon. At the same time, a precision edge 65 is formed which enables die 5 to be assembled end to end with other like dies without loss or distortion of image at the die junctures. It will be understood that the opposite end of die 5 is formed in the same manner.

This operation is repeated in each V-groove 34 of wafer 20, after which the cutting is done along lines 33 to complete the cutting off of individual dies. As a resuIt, each end 11 of die 5 is formed with a uniformly flat and smooth surface, the surfaces precisely defining the die ends and enabling die 5 to be assembled with other dies end to end to form a long array 4 composed of a plurality of dies 5.

It is understood that other chemical etchants, other etching techniques such as plasma etching, etc., and/or use of materials with different crystalline orientation may result in grooves other than the V-shaped grooves discussed. Further, that the order in which dies 5 are cut from wafer 20 may be changed by first cutting along lines 33 followed by cutting along grooves 34. And, while V-shaped grooves 34 are desribed as being formed by etching, grooves 34 may instead be formed by other suitable processes such as scribing, sand blasting, water jet cutting, laser cutting, etc. Similarly, forming wide grooves 40, cutting along lines 33, and/or cutting in V-shaped grooves 34 may be done by other suitable processes such as water jet cutting, laser cutting, etc. instead of by sawing.

While CCD type sensor dies are shown and described herein, other types of arrays, materials other than silicon, and other crystalline orientations may be contemplated. Further, while image scanning or reading dies are described, image writing dies having, for example, one or more linear rows of selectively actuable LED's may may be contemplated.

Referring particularly to FIGS. 6a and 6b, it is understood that where two dimensional arrays are contemplated, V-shaped grooves 34 may be formed along lines 33 and the dies separated from the wafer in the manner described. This provides precision faces which enable the dies to be assembled side to side to provide a two dimensional array. FIG. 6a depicts a die assembly in which photosites 12 and active elements 17 are in opposing relation to one another, while FIG. 6b depicts a die assembly in which the row 14 of photosites 12 of each die are opposite one another. All four faces, i.e. long sides 6 and ends 11, may be fabricated in the manner described herein to provide precision faces enabling the dies to be assembled end to end and side to side to form a longer two dimensional array.

It will be understood that face to face assembly of dies 5 as described and shown herein may be affected through physical abutting of the die faces together or in close but spaced proximity to one another.

While the invention has been described with reference to the structure disclosed, it is not confined to the details set forth, but is intended to cover such modifications or changes as may come within the scope of the following claims.

We claim:

1. A method of fabricating high resolution image sensor dies from a wafer so that said dies have precision faces to enable said dies to be assembled with other like dies to form a larger array without image loss or distortion at the points where said dies are assembled together, comprising the steps of:
    (a) etching small V-shaped grooves in one side of a <100> silicon wafer delineating the faces of the dies where the dies are to be separated from said wafer, the walls of said V-shaped grooves paralleling the <111> crystalline plane of said wafer;
    (b) forming grooves in the opposite side of the wafer opposite each of said V-shaped grooves, the axis of said grooves being parallel to the axis of the V-shaped groove opposite thereto; and
    (c) sawing said wafer along said V-shaped grooves with one side of the cut made by sawing being substantially coextensive with the bottom of said V-shaped grooves whereby one side of said V-shaped grooves is at least partially obliterated by said sawing, the sides of said V-shaped grooves tha remain serving to prevent development of fractures in said die beyond said remaining side as said wafer is being sawed.

2. A method of separating semiconductor image sensor dies from a larger wafer to provide dies with precision ends which enable the dies to be joined against one another end to end to form longer arrays without image loss or distortion at the points where the dies are joined, comprising the steps of:

(a) forming first V-shaped grooves on the surface of said wafer where said dies are to be separated from said wafer, said first V-shaped grooves having a width of substantially 5 to 20 μm;

(b) forming second grooves on the surface of said wafer opposite each of said first grooves, said second grooves being deeper than said firt grooves and less than the thickness of said wafer, said second grooves being wider than said first grooves to facilitate separating individual dies from said wafer; and (c) making a relatively wide cut through said wafer along said first V-shaped grooves with one edge of said cuts being substantially aligned with the bottom of said first V-shaped grooves whereby one side of said first V-shaped grooves is removed by said cut while the remaining side of said V-shaped grooves remains substantially intact, said cut separating said individual dies from said wafer with the ends of said dies being smooth and undistorted, the remaining side of said V-grooves inhibiting fracturing of said wafer as said wafer is cut.

3. A method for producing photosensitive scanning dies having precisely controlled ends enabling one of the dies to be assembled against another of the dies to form a longer composite array without distortion or damage to the image scanning properties of the dies, the dies being cut from a larger <100> silicon wafer, comprising the steps of:

(a) etching relatively small first grooves in one side of said wafer defining said die ends, the walls of said first grooves paralleling the <111> crystalline plane of said wafer;

(b) forming a relatively wide second groove in the opposite side of said wafer in association with each of said first grooves, the axis of each of said second grooves being parallel to the axis of said first groove associated therewith; and (c) cutting said dies from said wafer by sawing through said wafer at each of said first grooves with one edge of the cut made by sawing substantially aligned with the bottom of said first grooves, the remaining uncut side of said first groove entrapping fractures and chipping resulting from sawing whereby to provide dies with uniform precise ends and without damage to active elements on said dies proximate said die ends.

4. A method for producing photosensitive scanning dies having precisely controlled ends enabling one of the die to be assembled against another of the dies to form a longer composite array without distortion or damage to the image scanning properties of the dies, the dies being cut from a larger <100> silicon wafer, comprising the steps of:

(a) etching relatively small first grooves in one side of said wafer defining said die ends, the walls of said first grooves paralleling the <111> crystalline plane of said wafer;

(b) forming second grooves in the opposite side of said wafer in association with each of said V-shaped grooves, the axis of each of said second grooves being parallel to the axis of said V-shaped groove associated therewith;

(c) cutting said dies from said wafer by sawing through said wafer at each of said V-shaped grooves, the width of the cut made by sawing being substantially wider than the width of said V-shaped grooves;

(d) locating said cut so that one edge of said cut is substantially aligned with the bottom of said V-shaped grooves whereby said cut removes one side of said V-shaped grooves while the remaining side of said V-shaped grooves is substantially preserved, said remaining side of said V-shaped grooves inhibiting fracturing and chipping resulting from said sawing whereby there is provided dies with uniform precise ends and without damage to active elements on said dies proximate said die ends.

5. A method for producing a scanning die having precisely controlled ends enabling said die to be assembled with other like dies to form a longer composite array without distortion or damage to the image scanning properties of the dies, said dies being cut from a larger <100> silicon wafer, comprising the steps of:

(a) etching a small V-shaped groove in one side of said wafer where said die is to be cut from said wafer, the walls of said V-shaped groove paralleling the <111> crystalline plane of said wafer;

(b) forming a second groove in the opposite side of said wafer substantially opposite said V-shaped groove, the axis of said second groove being parallel to the axis of said V-shaped groove;

(c) cutting said die from said wafer by cutting through said wafer at said V-shaped groove, the width of the cut made by cutting being substantially wider than the width of said V-shaped groove; and (d) locating said cut so that one edge of said cut is substantially aligned with the bottom of said V-shaped groove whereby said cut removes the side of said V-shaped groove opposite said die while substantially preserving the other side of said V-shaped groove intact, said other side of said V-shaped groove inhibiting fracturing and chipping resulting from cutting whereby there is provided a die having a uniform precise end without damaging active elements on said die proximate said end.

6. The method according to claim 5 in which steps a-d are repeated at the point where the opposite end of said die is to be formed whereby to provide a second uniform precise end of said die and complete said die without damaging active elements on said die.

7. A method of separating semiconductor image sensor dies from a larger wafer to provide dies with precision ends which enable the dies to be joined against one another end to end to form longer composite array without image loss or distortion at the points where the dies are joined, comprising the steps of:

(a) non-mechanically forming V-shaped grooves on the surface of said wafer where said dies are to be separated from said wafer, said V-shaped grooves having a width and a height;

(b) mechanically forming second grooves on the surface of said wafer opposite each of said V-shaped grooves to facilitate separating individual dies from said wafer, said second grooves being deeper than said V-shaped grooves, said second grooves being wider han said V-shaped grooves; and (c) mechanically cutting through said wafer along said V-shaped grooves with one edge of the cut being substantially aligned with the bottom of said V-shaped grooves, the width of said cut being greater than the width of said V-shaped grooves whereby one side of said V-shaped grooves is removed by said cut while the remaining side of said V-shaped grooves remains substantially intact, said cut separating said individual dies from said wafer with the ends of said dies being smooth and undistorted, said remaining side of said V-grooves inhibiting fracturing of said wafer as said wafer is cut.

8. The method according to claim 7 including the step of mechanically forming said second grooves by sawing.

9. The method according to claim 7 including the step of nonmechanically forming said V-shaped grooves by anisotropic etching.

10. The method according to claim 7 including the step of mechanically cutting through said wafer at substantially right angles to said first mentioned cut to separate said dies from one another.

11. A method of fabricating high resolution image sensor dies from a wafer so that said dies have precision faces to enable said dies to be assembled with other like dies to form a larger array without image loss or distortion at the points where said dies are assembled together, comprising the steps of:

(a) etching small V-shaped grooves in one side of a <100> silicon wafer delineating the faces of the dies where the dies are to be separated from said wafer, the walls of said V-shaped grooves paralleling the <111> crystalline plane of said wafer;

(b) forming lines substantially perpendicular to the axis of said V-shaped grooves;

(c) cutting said wafer along said V-shaped grooves with one side of the cut being substantially coextensive with the bottom of said V-shaped grooves whereby one side of said V-shaped grooves is at least partially obliterated by said cutting, the sides of said V-shaped grooves that remain serving to prevent development of fractures in said die as said wafer is being cut; and (d) cutting along said lines to complete separating of said dies from said wafer.

12. The method according to claim 11 including the step of:

forming relatively wide grooves in the opposite side of the wafer opposite each of said V-shaped grooves before cutting to facilitate separation of said dies along said V-shaped grooves.

13. A method of fabricating high resolution image sensor dies having active and inactive sides from a wafer so that said dies have precision faces to enable said dies to be assembled with other like dies to form a larger array without image loss or distortion at the points where said dies are assembled together, comprising the steps of:

(a) forming relatively wide grooves in said inactive side of said wafer in the area where said dies are to be separated from said wafer;

(b) etching relatively small V-shaped grooves in said active side of said wafer opposite to and parallel with each of said wide grooves; and (c) sawing along said V-shaped grooves through said wafer to said wide grooves whereby to separate said dies from said wafer, one side of the cut made by sawing being substantially coextensive with the bottom of said V-shaped grooves whereby one side of said V-shaped grooves is at least partially obliterated by said sawing, the sides of said V-shaped grooves that remain serving to prevent development of fractures in said die beyond said remaining side as said wafer is being sawed.

14. The method according to claim 1 including the step of:

fabricating said dies so that said precision faces comprise the opposite ends of said dies enabling plural ones of said dies to be assembled together end to end to form a longer one dimensional array.

15. The method according to claim 1 including the step of:

fabricating said dies so that said precision faces comprise the top and bottom sides of said dies enabling plural ones of said dies to be assembled together top to bottom to form a larger two dimensional array.

16. The method according to claim 1 including the step of:

fabricating said dies so that said precision faces comprise the opposite ends and top and bottom sides of said dies enabling plural ones of said dies to be assembled together end to end and top to bottom to form a longer two dimensional array.

* * * * *